United States Patent [19]

Fukai et al.

[11] Patent Number: 6,028,647
[45] Date of Patent: Feb. 22, 2000

[54] AUTOMATIC GAIN CONTROL CIRCUIT USING PIN DIODE CAPABLE OF IMPROVING NOISE FIGURE WHILE IMPROVING FREQUENCY BAND CHARACTERISTIC AND BIDIRECTIONAL CATV RECEIVER INCLUDING SUCH CIRCUIT

[75] Inventors: Seiichirou Fukai; Shigeto Masuda, both of Osaka, Japan

[73] Assignee: Sharp Kabushiki Kaisha, Osaka, Japan

[21] Appl. No.: 08/886,204

[22] Filed: Jul. 1, 1997

[30] Foreign Application Priority Data

Jul. 1, 1996 [JP] Japan ................................. 8-171029

[51] Int. Cl.[7] ...................................................... H04N 5/50
[52] U.S. Cl. ........................ 348/731; 348/731; 348/735; 348/712; 348/713; 455/239.1; 455/240.1; 455/248.1; 455/249.1
[58] Field of Search ...................................... 348/731, 735, 348/712, 713, 678, 680, 681, 685, 733; 455/239.1, 240.1, 248.1, 249.1; 333/17.3, 124; 330/284, 145

[56] References Cited

U.S. PATENT DOCUMENTS

| 3,823,379 | 7/1974 | George | 348/685 |
| 4,275,362 | 6/1981 | Harford | 330/283 |
| 4,369,414 | 1/1983 | Aoki et al. | |
| 4,520,507 | 5/1985 | Moon | 455/3 |
| 5,243,300 | 9/1993 | Kubo | 330/284 |
| 5,270,824 | 12/1993 | Dobrovolny | 348/731 |
| 5,774,194 | 6/1998 | Armbruster | 348/731 |

FOREIGN PATENT DOCUMENTS

| 57-054414 | 3/1982 | Japan . |
| 4-371010 | 12/1992 | Japan . |
| 7-336177 | 12/1995 | Japan . |
| 22519320 | 9/1996 | Japan . |

*Primary Examiner*—John K. Peng
*Assistant Examiner*—Paulos Natnael

[57] ABSTRACT

An input high frequency signal passes through a PIN diode having a variable high frequency resistance and is output from an AGC circuit. The PIN diode is connected so as to be biased forward between an AGC signal level and a fixed voltage level (such as ground potential). A bias resistor and a coil are connected in series between a node on the output side of the PIN diode and a node supplied with the ground potential. More specifically, the resistor and the coil are inserted in parallel between the transmission path for high frequency signals and the ground potential.

18 Claims, 6 Drawing Sheets

AUTOMATIC GAIN CONTROL CIRCUIT USING PIN DIODE CAPABLE OF IMPROVING NOISE FIGURE WHILE IMPROVING FREQUENCY BAND CHARACTERISTIC AND BIDIRECTIONAL CATV RECEIVER INCLUDING SUCH CIRCUIT

BACKGROUND OF THE INVENTION

1. Field of the Invention

The present invention relates generally to automatic gain control (hereinafter "AGC") circuits for use in a high frequency circuit device such as, a television receiver, CATV receiver and/or videotape recorder. Specifically, the invention relates to an AGC circuit using a PIN diode (P type-Intrinsic N type semiconductor diode) and a CATV receiver including such a circuit.

2. Description of the Related Art

The configuration and operation of a conventional AGC circuit will be described in conjunction with FIGS. 6 to 8. FIG. 6 is a block diagram showing the configuration of a tuner portion 2000 in a conventional bidirectional CATV receiver.

A terminal 10 is provided with high frequency signal inputs from a broadcasting station or a key station. The band of such high frequency signals is for example in the range from 52 MHz to 750 MHz.

A band pass filter 13 selectively passes only signals in the band of 52 MHz to 750 MHz among the input high frequency signals. An AGC circuit 44 receives a signal output from band pass filter 13 and controls the gain for the input high frequency signal based on the level of an AGC signal input to the terminal 15 of AGC circuit 44. A high frequency amplifier 16 receives and amplifies the high frequency signal from AGC circuit 44, and outputs the result to a mixer 17.

A local oscillator 18 oscillates a signal of a frequency shifted from the broadcasting frequency of a station chosen by the amount of intermediate frequency output to mixer 17. The intermediate frequency is for example 953 MHz.

Mixer 17 mixes the signal output from local oscillator 18 with the input high frequency signal.

The resulting mixed signal includes various frequency components. A band pass filter 19 limitatively passes signals in the band of for example 953 MHz among the signals output from mixer 17, and outputs a first intermediate frequency signal.

Then, an intermediate frequency amplifier 20 amplifies the first intermediate frequency signal, and a band pass filter 21 limits the band of the signal to pass.

A mixer 22 mixes the first intermediate frequency signal passed through band pass filter 21 and the signal transmitted by a local oscillator 23. The signal produced by mixing in a mixer 22 is received by a band pass filter 24, which in turn limits the band of the signal to pass, and outputs a second intermediate frequency signal of for example 43.5 MHz.

An intermediate frequency amplifier 25 amplifies the second intermediate frequency signal from band pass filter 24 for output to a terminal 26.

Terminal 11 receives a signal output to a broadcasting station or key station from the receiving side (hereinafter "up signal"). The up signal used has a frequency band lower than a signal received from the broadcasting station (hereinafter "down signal") and not higher than 42 MHz. Band pass filter 12 limits the band of the up signal to be applied to terminal 11 and outputs the band-limited signal to terminal 10.

Note that in the tuner in the bidirectional CATV receiver shown in FIG. 6, the gain of a received signal is controlled by AGC circuit 44. If high frequency amplifier 16 receives a signal in a level higher than specified, a signal output therefrom is distorted, which causes disturbance such as intermodulation and cross modulation. Therefore, AGC circuit 44 is usually provided preceding to high frequency amplifier 16.

The AGC signal applied to AGC circuit 44 is output from an AGC control circuit (not shown) which changes the level of the AGC signal to output depending upon the intensity of a signal received from intermediate frequency amplifier 25.

FIG. 7 is a circuit diagram showing the configuration of the conventional AGC circuit 44.

Herein, diodes D1 to D3 are PIN diodes.

FIG. 8 is a graph showing the change of high frequency resistance (rd) as the forward current of PIN diode (If) changes.

Now, referring to FIGS. 7 to 8, the operation of the conventional AGC circuit 44 will be detailed.

Referring to FIG. 7, terminal 1 is provided with a high frequency signal output from band pass filter 13 (see FIG. 6). The gain relative to the input high frequency signal is controlled depending on the gain of the AGC signal as will be described, and a high frequency signal is output from terminal 2.

The high frequency signal output from terminal 2 is transmitted to high frequency amplifier 16 shown in FIG. 6.

The voltage level of the AGC signal varies for example in the range from 0 to 8 V. The AGC signal is generated based on the intensity level of the intermediate frequency output, and the gain of the tuner is feedback-controlled in response to the AGC signal, so that the intensity of intermediate frequency output from the tuner is controlled to be constant.

The bias voltage supplied to the connection point of diode D2 and a capacitor C2 is voltage produced by dividing power supply voltage VB by resistors R1 and R2. The potential on the connection point of diode D2 and capacitor C2 is set lower than the potential on the connection point of diode D1 and a bias resistor R3 when the AGC voltage is maximized.

When the AGC signal level is at a maximum value, current is passed through a coil L2, diode D1 and bias resistor R3 by the voltage supplied by the AGC signal. The larger the current value, the smaller becomes the high frequency resistance of diode D1 as shown in FIG. 8, and the signal gain of the AGC circuit decreases as a result.

Note that the values of resistors R1 and R2 are set so that diodes D2 and D3 are both reversely biased when the AGC signal level is at its maximum value.

Then, as the AGC signal level decreases from its maximum value, current passed through diode D1 decreases as well, and the potential at the connection point of diode D1 and resistor R3 is lowered as a result. Current passed through diodes D2 and D3 increases accordingly. The high frequency resistance of diode D1 increases, and the high frequency resistance of diodes D2 and D3 decreases.

As a result, the high frequency resistance of PIN diode D1 disposed along the direction of the transmission of high frequency signals increases, while the high frequency resistance of PIN diodes D2 and D3 disposed crossing the direction of transmission decreases, resulting in an increase in the attenuation amount of the AGC circuit.

In order to output a signal input from terminal 1 with a maximum gain, in other words with a minimum attenuation, to terminal 2, the resistance value of bias resistor R3 is lowered and the value of current passed through diode D1 is increased for the purpose of reducing the attenuation of the signal and improving the noise figure.

Thus, the high frequency resistance of diode D1 decreases. However, if the resistance value of bias resistor R3 is extremely reduced, the impedance of the AGC circuit is lowered as a result, which conversely increases the noise figure.

The resistance value of bias resistor R3 should be set taking into account the balance between improvement of the noise figure due to current increase and the increase of the noise figure due to lowered impedance. Therefore, in the AGC circuit as shown in FIG. 7, for example, the resistance value of bias resister R3 is about several k Ω, in other words it should be set to a relatively large value.

More specifically, in the conventional AGC circuit as shown in FIG. 7, even for the maximum level of the AGC signal, the high frequency resistance of diode D1 is not sufficiently lowered, and therefore the noise figure increases.

In order to restrict the noise figure from increasing as much as possible, the resistance value of bias resistor R3 should be reduced so that more current may be passed through diode D1. However, if the resistance value of bias resistor R3 is too small, the impedance of the circuit conversely decreases, which increases the noise figure.

SUMMARY OF THE INVENTION

It is therefore an object of the invention to provide an AGC circuit using a PIN diode capable of restricting the noise figure from increasing without lowering the impedance of the circuit itself if the PIN diode disposed along the direction of the transmission of the high frequency signal is biased so that its high frequency resistance is sufficiently lowered.

Another object of the invention is to provide a bidirectional CATV receiver capable of improving the frequency characteristic of the lower side of the receiving frequency band and the noise figure, and restricting data interference and disturbance when a signal is transmitted to a broadcasting station from the receiver side.

Briefly stated, an AGC circuit according to the invention includes a signal input node, a signal output node, a reference potential node, a first PIN diode, and an impedance element.

The signal input node receives an externally applied high frequency signal. The signal output node outputs a high frequency signal from the AGC circuit. The reference potential node is supplied with a prescribed potential. The first PIN diode receives a high frequency signal from the signal input node at its one end and outputs a high frequency signal to be applied to the signal output node from its the other end. The impedance element is connected between the other end of the first PIN diode and the reference potential node. The first PIN diode has its portion between its one end and its the other end biased forward in response to an externally applied AGC signal and its high frequency resistance changes as the current value in the forward direction changes. The impedance elements includes a bias resistor and an inductor connected in series with each other.

More preferably, a capacitor is connected in parallel to the bias resistor.

According to another aspect of the invention, a tuner in a bidirectional CATV receiver includes a signal input/output terminal, a first band pass filter, an automatic gain control circuit, a high frequency amplification circuit, a sense amplification circuit, a gain control circuit, and a second band pass filter. The signal input/output terminal receives an externally applied high frequency signal and externally outputs a high frequency signal. The first band pass filter passes an input signal in a prescribed band applied to the signal input/output terminal. The automatic gain control circuit receives a signal output from the first band pass filter and outputs the signal attenuated based on the level of the AGC signal. The automatic gain control circuit includes a signal input node to receive an externally applied high frequency signal, a signal output node to output a high frequency signal from the automatic gain control circuit, a reference potential node supplied with a prescribed potential, a first PIN diode which has one end to receive a high frequency signal from the signal input node and the other end to output a high frequency signal to be applied to the signal output node and an impedance element connected between the other end of the first PIN diode and the reference potential node. The first PIN diode is biased forward in response to the AGC signal, and as the current value in the forward direction changes the high frequency resistance changes. The impedance element includes a bias resistor and an inductor connected in series to each other.

The high frequency amplification circuit receives and amplifies the output of the automatic gain control circuit. The sense amplification circuit receives the output of the high frequency amplification circuit and extracts an intermediate frequency transmission signal. The gain control circuit outputs an AGC signal according to the level of the output signal of the sense amplification circuit. The second band pass filter passes a signal in a prescribed band applied to the signal input/output terminal.

Therefore, according to the present invention, the resistance value of the bias resistor for the PIN diode may be advantageously reduced without reducing the impedance of the AGC circuit. Thus, a large amount of current may be passed through the PIN diode, and the noise figure may be improved while increasing the maximum gain of the AGC circuit.

Furthermore, according to the present invention, a trap is provided on the frequency side lower than the frequency band of a high frequency signal to receive, and the frequency characteristic on the lower side of the receiving frequency band may be improved. Therefore, not only the noise figure may be improved, but also signals in a lower frequency region than the receiving frequency band may be prevented from coming in, thereby restricting data interference and disturbance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
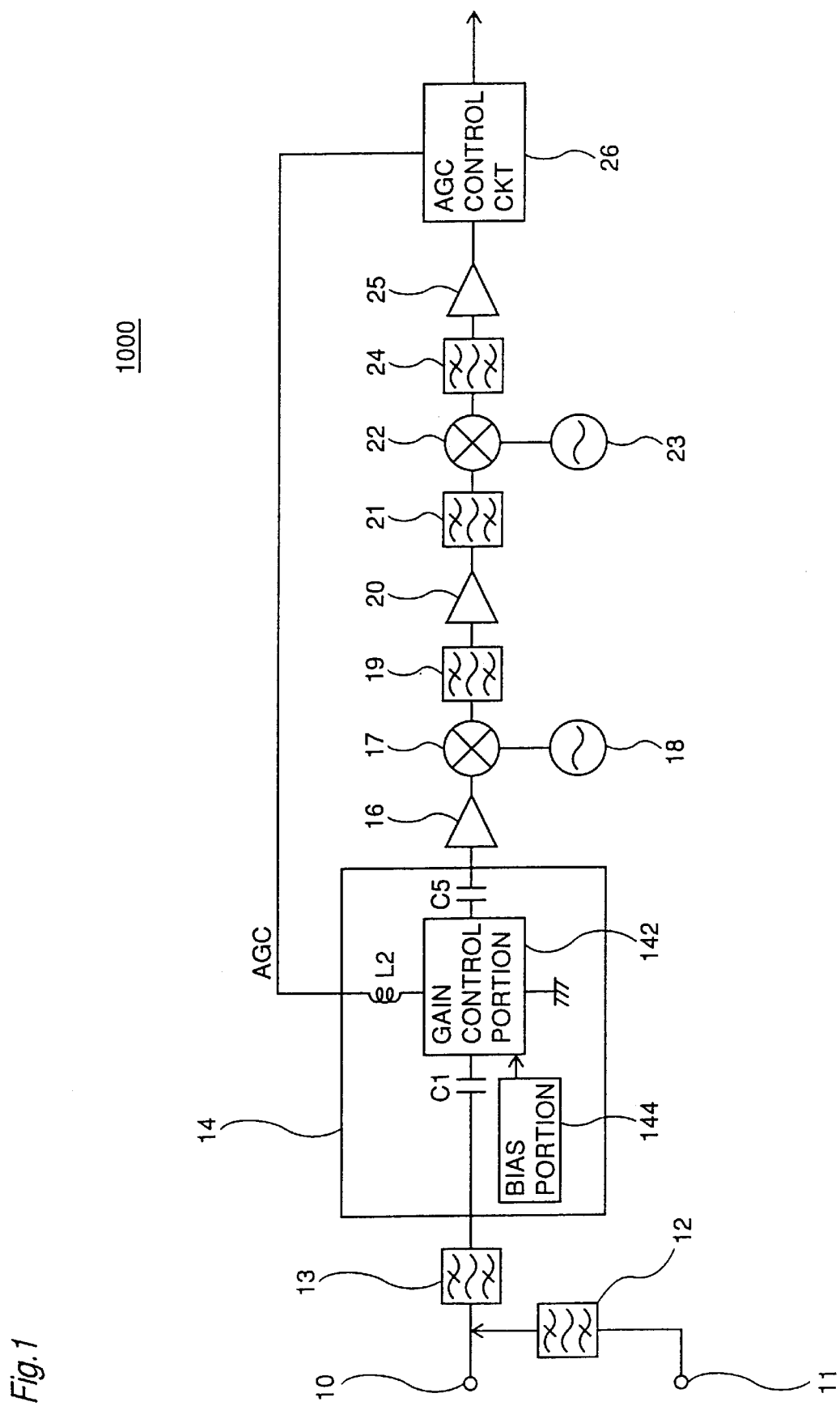
FIG. 1 is a block diagram schematically showing the configuration of a tuner in a bidirectional CATV receiver according to a first embodiment of the invention.
Figure 6:
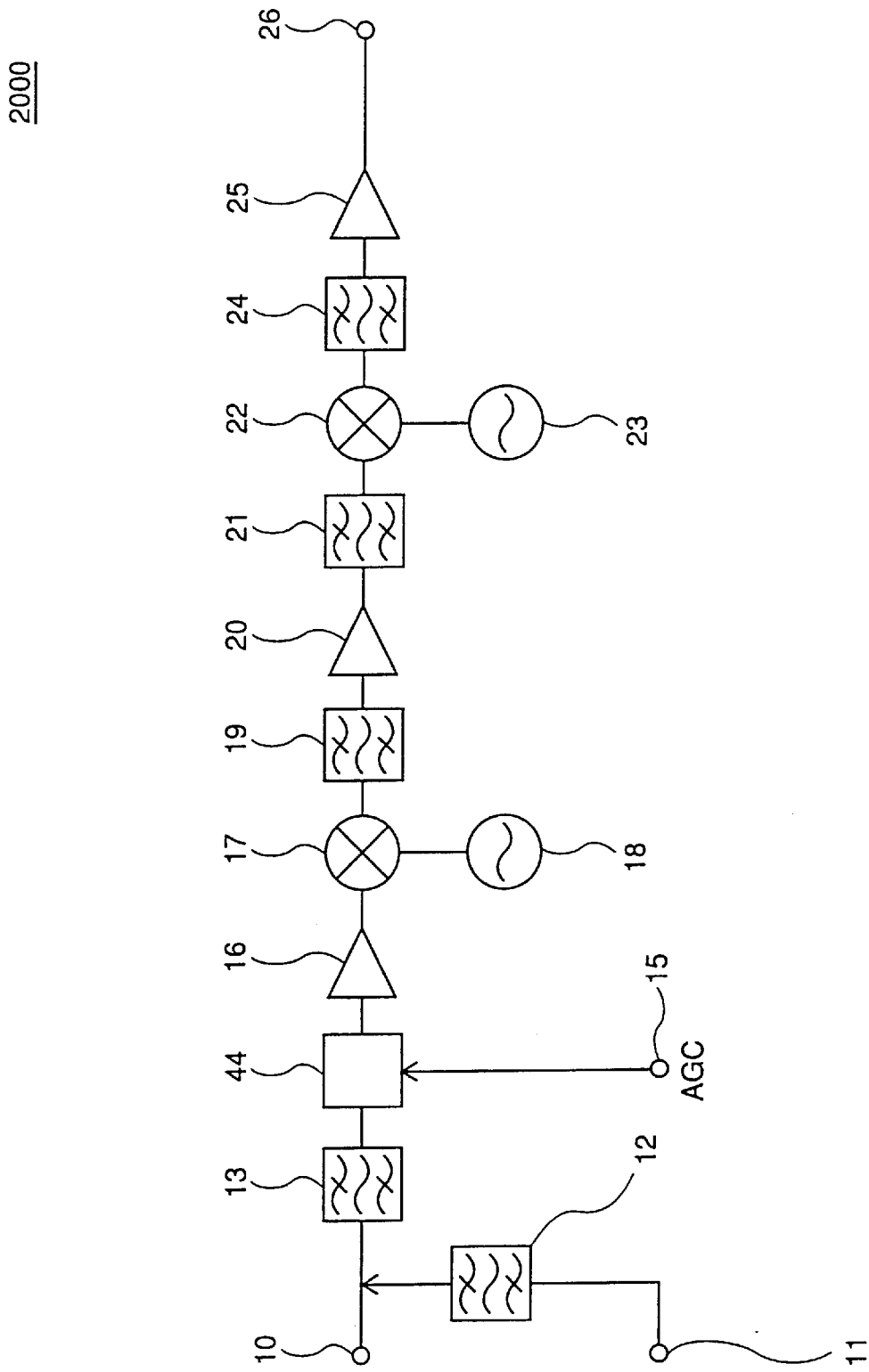
FIG. 6 is a block diagram schematically showing the configuration of a tuner in a conventional bidirectional CATV receiver.

FIG. 1 is a block diagram schematically showing the configuration of a tuner 1000 in a bidirectional CATV receiver according to a first embodiment of the invention;

The configuration of tuner 1000 is substantially identical to that of conventional tuner 2000 shown in FIG. 6 except for the configuration of AGC circuit 14, like portions are denoted with like reference numerals and the detailed description will not be repeated.

Now, as specifically shown in FIG. 1, in tuner 1000 according to the first embodiment, there is provided an AGC control circuit 26 which receives an intermediate frequency signal output from intermediate frequency amplifier 25 and outputs an AGC signal to AGC circuit 14 according to the output intensity level of the intermediate frequency signal.

AGC circuit 14 includes a coupling capacitor C1 which receives a high frequency signal from band pass filter 13 at its one end, an inductor L2 for isolation which receives an AGC signal from AGC control circuit 26 at its one end, a gain control portion 142 which receives a high frequency signal from the other end of coupling capacitor C1 and controls a gain relative to the high frequency signal based on the AGC signal received from the other end of inductor L2 for isolation, a bias portion 144 which supplies a prescribed bias voltage to gain control portion 142, and a coupling capacitor C5 having one end to receive a high frequency signal output from gain control portion 142 and the other end connected to high frequency amplifier 16.

Figure 2:
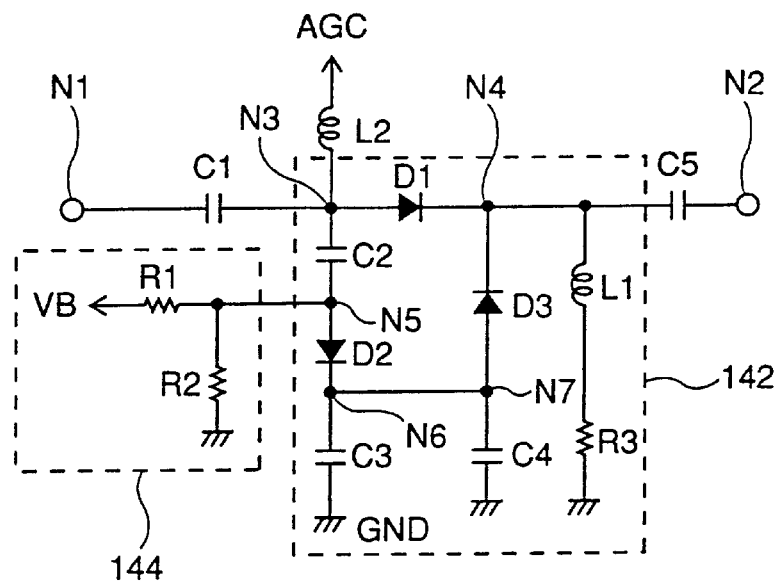
FIG. 2 is a circuit diagram showing the configuration of an AGC circuit 14 shown in FIG. 1.

FIG. 2 is a diagram showing in more detail the configuration of AGC circuit 14 shown in FIG. 1. Coupling capacitor C1 is connected between a node N1 receiving a high frequency signal from band pass filter 13 and a node N3 in gain control portion 142.

Node N3 is connected to the one end of inductor L2 for isolation which receives the AGC signal at that other end.

Gain control portion 142 includes a PIN diode D1 connected between nodes N3 and N4 so that the direction from node N3 to node N4 corresponds to the forward direction, and a capacitor C2, a PIN diode D2, and a capacitor C3 connected in series between node N3 and a node GND supplied with ground potential. Capacitor C2 has its one end connected to node N3. The connection point of the other end of capacitor C2 and diode D2 is a node N5, and the connection point of one end of capacitor C3 having its other end connected to ground node GND and PIN diode D2 is a node N6. PIN diode D2 is connected so that the direction from node N5 to node N6 corresponds to the forward direction.

Gain control portion 142 further includes a PIN diode D3 and a capacitor C4 connected in series between node N4 and ground potential node GND. The connection node of the one end of capacitor C4 having its other end connected with ground node GND and PIN diode D3 is a node N7. PIN diode D3 is connected so that the direction from node N7 to node N4 corresponds to the forward direction. Node N6 and node N7 are connected with each other.

Gain control portion 142 further includes an inductor L1 and a bias resistor R3 connected in series between node N4 and ground node GND.

There is a coupling capacitor C5 connected between node N4 and node N2 from which an output signal from AGC circuit 14 is output.

Bias portion 144 supplies a prescribed potential level to node N5. Bias portion 144 includes resistors R1 and R2 connected in series between power supply potential VB and ground potential GND. The potential level produced by dividing the prescribed potential level based on the ratio of resistance values of resistors R1 and R2 is supplied to node N5.

If, for example, the AGC signal is at 6 V, the potential level supplied to node N5 is set at about 2 V. As the potential level of node N5 is thus set, the voltage drop of PIN diode D2 for example causes the potential level of node N6 (i.e., node N7) to be about 4 V.

Therefore, for the AGC signal level at about 6 V, PIN diodes D2 and D3 are both reversely biased.

Figure 7:
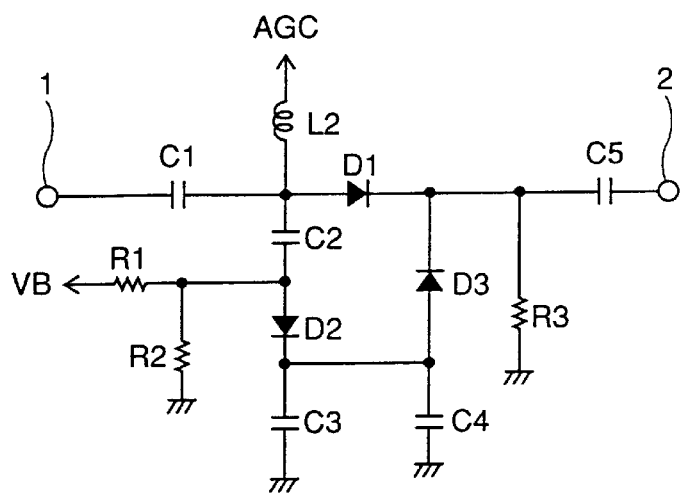
FIG. 7 is a circuit diagram showing the configuration of a conventional AGC circuit.

Unlike the conventional AGC circuit shown in FIG. 7, AGC circuit 14 according to the first embodiment has inductor L1 and bias resistor R3 connected in series between node N4 and ground potential node GND.

In AGC circuit 14 according to the first embodiment, since coil L1 is connected in series with bias resistor R3, the impedance of AGC circuit 14 is kept at a high level. Reducing the resistance value of bias resistor R3 does not reduce the impedance to a high frequency signal. Reducing the resistance value of bias resistor R3 allows current flowing through PIN diode D1 to be increased.

Figure 8:
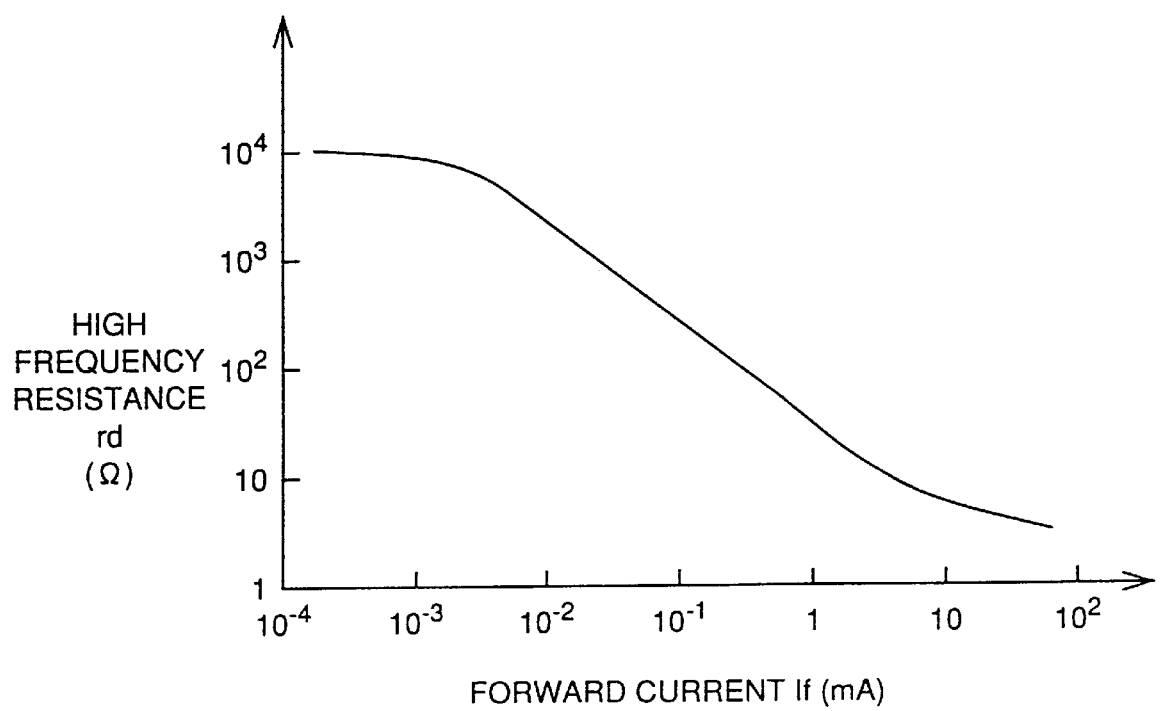
FIG. 8 is a graph showing the dependence of high frequency resistance on the forward current of a PIN diode.

As shown in FIG. 8, PIN diode D1 has its high frequency resistance (rD) reduced as the forward current (If) increases. Therefore, in AGC circuit 14, the high frequency resistance along the direction of the transmission of the high frequency signal is reduced, which improves the noise figure of the AGC circuit.

In the conventional AGC circuit shown in FIG. 7, reducing the resistance value of bias resistor R3 reduces the impedance of the AGC circuit, which increases the noise figure.

Meanwhile, AGC circuit 14 according to the first embodiment can keep the impedance value at a high level, and therefore the noise figure is not increased.

Figure 4:
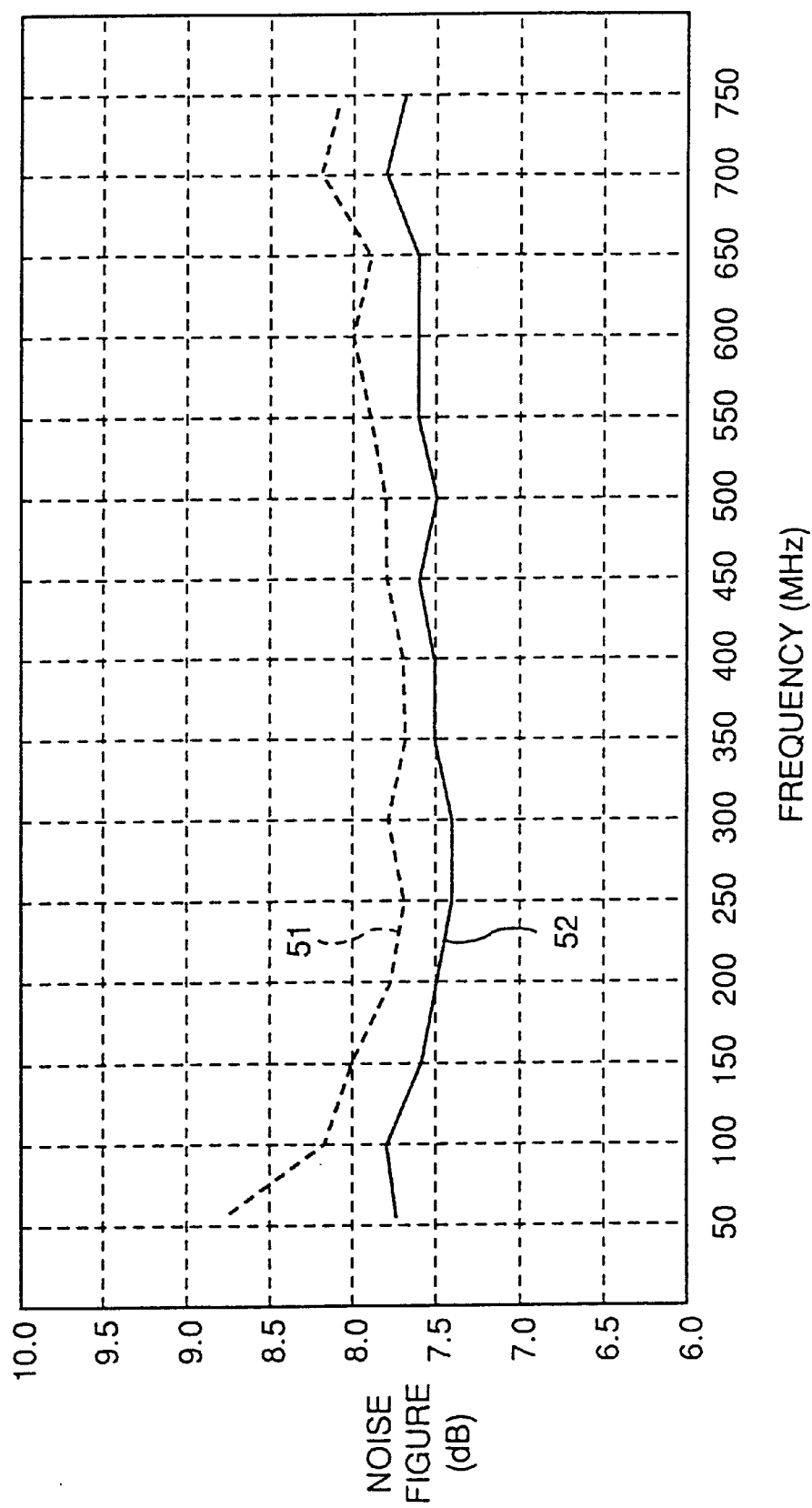
FIG. 4 is a graph showing the relation between the noise figure of AGC circuit 14 according to the first embodiment and the noise figure of a conventional AGC circuit 44.

FIG. 4 is a graph showing the frequency dependence of the noise figures of the conventional AGC circuit 44 and AGC circuit 14 according to the first embodiment.

Referring to FIG. 4, broken line 51 represents the dependence of the noise figure of the conventional AGC circuit 44 on the frequency, and solid line 52 that of AGC circuit 14 according to the first embodiment.

In the entire frequency band from 52 MHz to 750 MHz of received high frequency signals, AGC circuit 14 according to the invention has improved noise figure over conventional AGC circuit 44.

Note that AGC circuit 14 according to the first embodiment may be employed not only for the tuner in bidirectional CATV receiver 1000 as shown in FIG. 1, but also for a high frequency circuit device such as a general television receiver and a video tape recorder. In those other applications, the noise figure of each device relative to high frequency signals may be advantageously improved.

As shown in FIG. 2, in AGC circuit 14 according to the first embodiment, PIN diodes D2 and D3 are arranged in series in the forward direction in the path from node N5 to node N4 via nodes N6 and N7. This is because application of bias voltage on node N5 enables application of D.C. bias on both PIN diodes D2 and D3.

The invention is however not at all limited to such configuration, entirely the same effect may be expected as long as, in the path from node N1 to node N2 via nodes N3 and N4, i.e., the transmission path of a high frequency signal, D.C. bias voltage for the PIN diodes connected in parallel to the ground potential changes based on the potential level of the AGC signal.

Second Embodiment

Figure 3:
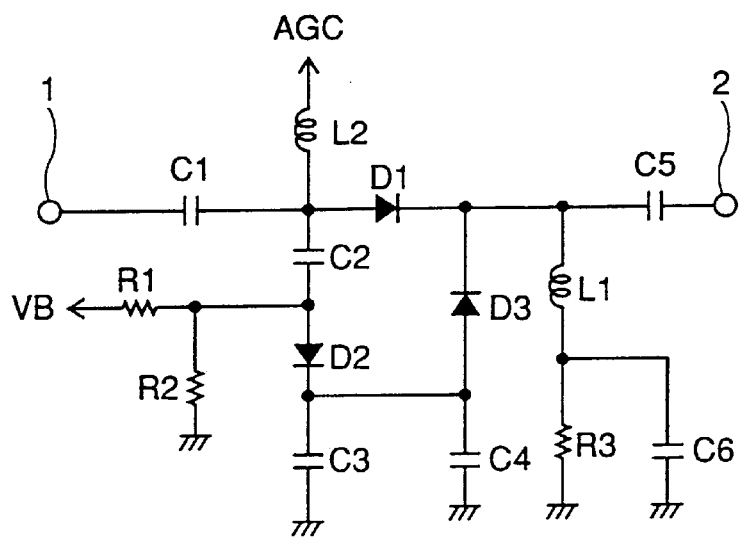
FIG. 3 is a circuit diagram showing the configuration of an AGC circuit 34 according to a second embodiment of the invention.

FIG. 3 is a diagram showing the configuration of an AGC circuit 34 in a tuner in a bidirectional CATV receiver according to a second embodiment of the invention.

The tuner in the bidirectional CATV receiver according to the second embodiment is basically identical to the first embodiment shown in FIG. 1 except for the configuration of AGC circuit 34.

In AGC circuit 34 according to the second embodiment is different from AGC circuit 14 according to the first embodiment in that a capacitor C6 is connected in parallel to bias resistor R3.

The other portions are substantially identical to those of AGC circuit 14 according to the first embodiment shown in FIG. 2, therefore like portions are denoted with like reference numerals and the detailed description will not be provided.

In the AGC circuit 34 according to the second embodiment, since capacitor C6 is connected in parallel to resistor R3, a series trap forms by coil L1 and capacitor C6.

The out-of-band rejection characteristic at a frequency f represented as follows may be improved.

$$f=1/\{2\pi(L1 \cdot C6)^{1/2}\}$$

wherein the inductance of coil Li is Li, and the capacitance of capacitor C6 is C6.

Figure 5:
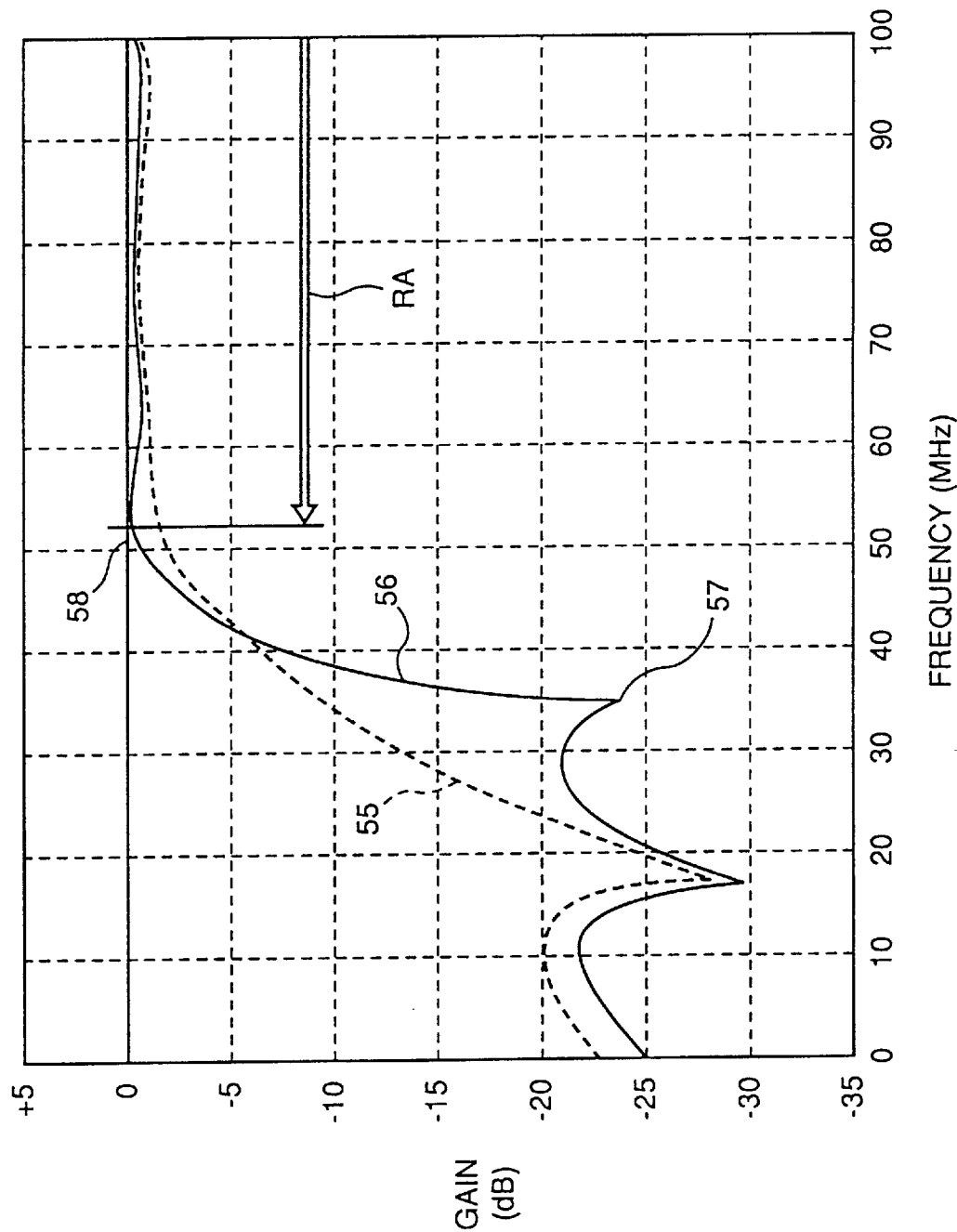
FIG. 5 is a graph showing the frequency dependence of the gains of the conventional AGC circuit 44 and AGC circuit 34 according to the second embodiment.

FIG. 5 is a graph showing the dependence of the gain of AGC circuit 34 on frequency when such a series trap is additionally provided in comparison with the dependence of the gain of conventional AGC circuit 44 on frequency.

Referring to FIG. 5, broken line 55 represents the frequency characteristic of conventional AGC circuit 44. Solid line 56 is the frequency characteristic of the gain of AGC circuit 34 according to the second embodiment.

As indicated by arrow RA in FIG. 5, in the receiving frequency band in the range from 52 MHz to 750 MHz, the insertion loss from tuner input end 10 to the output end of AGC circuit is virtually 0 dB (in other words the gain is 1.)

In the AGC circuit according to the second embodiment, as is AGC circuit 14 according to the first embodiment, the resistance value of the bias resistor may be reduced without lowering the impedance of the circuit. Therefore, a large amount of current may be passed through PIN diode D1, the high frequency resistance of diode D1 decreases, and therefore the maximum gain of the AGC circuit increases, thereby improving the noise figure.

Furthermore, in the AGC circuit 34 according to the second embodiment, capacitor C6 is additionally provided and a trap 57 appears in the frequency characteristic.

In tuner 1000 in the bidirectional CATV receiver as shown in FIG. 1, an up signal input from terminal 11 is prevented from coming into high frequency amplifier 16 by the function of trap 57. As a result, data interference or disturbance may be prevented.

In addition, according to the change of impedance characteristic caused by capacitor C6 and coil L1, as can be clearly seen in the region denoted by 58 in FIG. 5, the gain in the frequency region on the lower side of receiving frequency band may be restricted from lowering.

Thus, the gain is compensated for in the lower side of receiving frequency band, the noise figure may be further improved by using AGC circuit 34.

Therefore, in a high frequency circuit device such as CATV receiver, other television receivers, and video tape recorder, use of AGC circuit 34 may provide good demodulated images with reduced noises.

In addition, by the use of AGC circuit 34 in a tuner in a bidirectional CATV receiver, signals in a frequency region lower than the receiving frequency band may be prevented from coming into the side of high frequency amplifier in the receiver, and therefore data interference or disturbance can be prevented. More specifically, up signals are blocked before being amplified, and interference by the up signals with signals to receive may be restricted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An AGC circuit, comprising:
    a signal input node receiving a high frequency signal;
    a signal output node outputting a high frequency signal;
    a reference potential node supplied with a prescribed potential;
    a first diode having one end to receive a high frequency signal from the signal input node and the other end to output a high frequency signal to the output; and
    an impedance device connected between the other end of said first diode and said reference potential node,
    wherein the first diode is biased in the forward direction, and
    wherein the impedance device includes a bias resistor, an inductor, and a trap capacitor, wherein the bias resistor and inductor are connected in series, and the trap capacitor is connected in parallel to the bias resistor.

2. The AGC circuit of claim 1, wherein the first diode is a PIN diode.

3. The AGC circuit of claim 1, wherein the biasing of the first diode in the forward direction is based on an externally applied AGC signal.

4. The AGC circuit as recited in claim 1, further comprising:
    a second diode provided between the one end of the first diode and the reference potential nodes, so that the D.C. component of a signal is not transmitted and the high frequency component of the signal can be transmitted,
    a third diode provided between the other end of the first diode and the reference potential node, so that the D.C. component of a signal is not transmitted and the high frequency component of the signal can be transmitted,
    wherein the second and third diodes have their high frequency resistance values reduced when biased forward; and bias means for supplying such a prescribed bias potential that said second and third diodes are both reversely biased for a maximum value of said AGC signal, and that said second and third PIN diodes are both biased forward as the level of said AGC signal decreases.

5. The AGC circuit of claim 4, wherein the second and third diodes are PIN diodes.

6. The AGC circuit as recited in claim 1, further comprising:
- a first capacitor, a second diode and a second capacitor connected in series between the one end of the first diode and the reference potential node; and
- a third diode and a fourth capacitor connected in series between the other end of the first diode and the reference potential node,
- the second and fourth capacitors receiving the prescribed potential at their one ends,
- the anode of the second diode being connected to the other end of the second capacitor,
- the anode of the third diode being connected to the other end of the fourth capacitor,
- the connection node of the second diode and second capacitor being connected to the connection node of the third diode and fourth capacitor; and
- bias means for supplying such a prescribed bias potential to the connection node of the first capacitor and second diode that the second and third diodes are both reversely biased for a maximum value of said AGC signal.

7. The AGC circuit of claim 6, wherein the second and third diodes are PIN diodes.

8. A tuner for use in a bidirectional CATV receiver, comprising:
- a signal input/output terminal receiving an externally applied high frequency signal and externally outputting a high frequency signal;
- a first band pass filter for passing an input signal in a prescribed band applied to said signal input/output terminal;
- an automatic gain control means receiving a signal output from said first band pass filter and attenuating the signal based on the level of an AGC signal for output,
- the automatic gain control means including,
    - a signal input node receiving a high frequency signal from said first band pass filter,
    - a signal output node outputting a high frequency signal,
    - a reference potential node supplied with a prescribed potential,
    - a first diode having one end to receive a high frequency signal from the signal input node and the other end to output and a high frequency signal to be applied to the signal output node, and
    - an impedance device connected between the other end of the first diode and the reference potential node,
- wherein the first diode is biased in a forward direction,
- the impedance device including a bias resistor and an inductor connected in series; and
- high frequency amplification means for amplifying an output received from the automatic gain control means;
- sense amplification means receiving the output of the high frequency amplification means and extracting an intermediate frequency transmission signal;
- gain control means outputting the AGC signal based on the output signal level of the sense amplification means; and
- a second band pass filter for passing an output signal in a prescribed band applied to the signal input/output terminal.

9. The tuner as recited in claim 8, wherein the automatic gain control means further includes a trap capacitor connected in parallel to said bias resistor.

10. The tuner of claim 8, wherein the first diode is a PIN diode.

11. The tuner of claim 8, wherein the biasing of the first diode in the forward direction is based on an externally applied AGC signal.

12. The tuner as recited in claim 8, wherein the automatic gain control means includes:
- a second diode provided between the one end of the first diode and the reference potential node, so that the D.C. component of a signal is not transmitted and the high frequency component of the signal can be transmitted;
- a third diode provided between the other end of the first diode and the reference potential node, so that the D.C. component of a signal is not transmitted and the high frequency component of the signal can be transmitted,
- wherein the second and third diodes have their high frequency resistance values reduced as they are biased forward; and
- bias means for supplying such a prescribed bias potential that said second and third diodes are both reversely biased for a maximum value of said AGC signal and that said second and third diodes are both biased forward as the level of said AGC signal decreases.

13. The tuner as recited in claim 12, wherein the automatic gain control means further includes a trap capacitor connected in parallel to the bias resistor.

14. The tuner of claim 12, wherein the second and third diodes are PIN diodes.

15. An AGC circuit, comprising:
- a signal input node for receiving a high frequency signal;
- a signal output node for outputting a high frequency signal;
- a reference potential node having a prescribed potential;
- a diode having one end for receiving a high frequency signal from the signal input node, and the other end for outputting a high frequency signal to the signal output node; and
- an impedance device connected between the other end of the diode and the reference potential node, the impedance device further including a bias resistor, an inductor and a trap capacitor, wherein the bias resistor and inductor are connected in series, and the bias resistor and trap capacitor are connected in parallel.

16. The AGC circuit of claim 15, wherein the diode is a PIN diode.

17. A tuner for a CATV receiver, comprising,
- input/output terminal means for receiving and outputting a high frequency signal;
- filtering means for passing an input signal in a prescribed frequency band applied to said input/output terminal;
- automatic gain control means for attenuating a signal received from said filtering means, which is based on the level of an AGC signal for output,
- the automatic gain control means further including,
    - a signal input node for receiving a high frequency signal from said filtering means;
    - a signal output node for outputting a high frequency signal to an amplifier means;

a reference potential node having a prescribed potential;

a diode having one end for receiving a high frequency signal from the signal input node, and the other end for outputting a high frequency signal to the signal output node; and an impedance device connected between the other end of the diode and the reference potential node, the impedance device further including a bias resistor, an inductor and a trap capacitor, wherein the bias resistor and inductor are connected in series, and the bias resistor and trap capacitor are connected in parallel.

18. The tuner of claim 17, wherein the diode is a PIN diode.

* * * * *